United States Patent [19]

Assar et al.

[11] Patent Number: 5,300,835
[45] Date of Patent: Apr. 5, 1994

[54] CMOS LOW POWER MIXED VOLTAGE BIDIRECTIONAL I/O BUFFER

[75] Inventors: Mahmud Assar, Morgan Hill; Prakash C. Agarwal, San Jose; Vlad Bril, Campbell, all of Calif.

[73] Assignee: Cirrus Logic, Inc., Fremont, Calif.

[21] Appl. No.: 16,574

[22] Filed: Feb. 10, 1993

[51] Int. Cl.$^5$ .................................. H03K 19/0175
[52] U.S. Cl. ................................ 307/475; 307/451; 307/473
[58] Field of Search ............... 307/475, 296.2, 451, 307/473

[56] References Cited

U.S. PATENT DOCUMENTS

| | | | |
|---|---|---|---|
| 5,058,063 | 10/1991 | Wada et al. | 365/185 |
| 5,084,637 | 1/1992 | Gregor | 307/475 |
| 5,122,692 | 6/1992 | Seki | 307/475 |
| 5,128,560 | 7/1992 | Chern | 307/475 |
| 5,136,190 | 8/1992 | Chern et al. | 307/475 |
| 5,144,165 | 9/1992 | Dhong | 307/475 |
| 5,155,392 | 10/1992 | Nogle | 307/475 |
| 5,157,281 | 10/1992 | Santin et al. | 307/296.8 |
| 5,214,330 | 5/1993 | Okazaki | 307/475 |
| 5,245,224 | 9/1993 | Suzuki | 307/475 |

OTHER PUBLICATIONS

3 Volt System Logic for Personal Computers Data Book, Advance Micro Devices 1992, pp. 1-100 to 1-103.
Digital Integrated Electronics, Taub & Schilling 1977, pp. 156-161, 273-277.
Harris Semiconductor CMOS Logic ICs App. Note, Apr. 1986, "QMOS HC/HCT Logic Design for Battery-Powered or Battery-Backed Up Operation" by J. Nadolski, pp. 1-5.
Linear Interface Integrated Circuits, Motorola Semiconductor Products 1979, pp. 4-21 to 4-23, 4-132 to 4-136.
CMOS Data Book, National Semiconductor 1977, pp. 1-106 to 1-113 & 1-116.
Interface Data Book, National Semiconductor 1978, pp. 4-4 to 4-13.
Advanced CMOS Logic ICs Data Book, GE Corp./RCA Division, Oct. 1988, pp. 16-20.
CMOS Integrated Circuits Data Book, RCA Corp., Aug. 1983, pp. 78-81, 418-421, 687-694.
RCA/LSI Products-Applications, RCA Corp., Jan. 1982, "Interfacing CMOS/MOS with Other Logic Families" by A. Havasy & M. Kutzin, pp. 59-70.
High Speed CMOS Data Book, SGS-Thomson Microelectronics, Oct. 1988, pp. 57-59.
Power MOS Devices Data Book, SGS-Thomson Microelectronics, Jun. 1988, "Novel Protection and Gate Drives for MOSFET's Used in Bridge-Leg Configurations", pp. 131-136.
The Interface Circuits Data Book, Texas Instruments 1977, pp. 373-384.
High-Speed CMOS Logic Data Book, Texas Instruments, Jun. 1989, "Using High-Speed CMOS and Advanced CMOS Logic in Systems with . . . " by R. Curtis, pp. 4-17 to 4-25, 4-47 to 4-57.
C$^2$MOS Logic Data Book, Toshiba, Aug. 1990, "TC74AC/ACT & TC74HC/HCT Series", pp. AC4-8-AC51.

Primary Examiner—Edward P. Westin
Assistant Examiner—Andrew Sanders
Attorney, Agent, or Firm—Blakely, Sokoloff, Taylor & Zafman

[57] ABSTRACT

This invention describes the design and implementation of a low power CMOS bidirectional I/O buffer that translates low voltage core logic level signals into the highest logic level signals to drive the final output stage which outputs a selectable logic level signal. The invention further translates input signals of a variety of logic levels into low voltage core logic level signals. In either case, AC and DC power consumption is minimized in a mixed power supply environment that requires voltage translation to represent the proper binary logic levels.

30 Claims, 6 Drawing Sheets

CMOS LOW POWER MIXED VOLTAGE BIDIRECTIONAL I/O BUFFER

FIELD OF THE INVENTION

This invention relates to integrated circuits particularly to the design of an integrated circuit in a system with mixed DC voltage supplies. Specifically the invention relates to bidirectional I/O buffer design so that an integrated circuit may operate internal core logic at a low voltage and translate logic level signals such that the IC can interface with external pins that operate at similar or higher voltage levels.

BACKGROUND OF THE INVENTION

Power consumption in electronic devices can be approximated by the equation $P=VI$. Power consumption is equal to the value of the DC supply voltage multiplied by the amount of consumed current from the supply. Power consumption can be decreased by lowering the voltage supply (such as from five volts to three and one third volts) and or decreasing the amount of current consumed. The decrease in DC supply voltage from five volts to three volts will approximately decrease power consumption by forty percent. With the increase of portable electronics and battery operated systems the power consumption and operation time of portable units has become important. Electronics technology has charged from TTL to CMOS in order to decrease the current consumption thereby reducing power consumption. To further decrease power consumption it is desirable that the operating voltage be reduced.

Thus, to achieve low power consumption in portable computer systems it is necessary to operate at voltages below the present 5 V CMOS and TTL DC power supply of 5.0 V (volts) plus or minus 0.5 V. JEDEC (Joint Electronic Development Engineering Committee) specified two standards for low power systems known as LVCMOS (Low Voltage CMOS or 3.3 V CMOS) and LVTTL (Low Voltage TTL). Both of these standards require circuitry to operate with a 3.3 V plus or minus 0.3 V power supply. Other low voltage standards, such as LVBO CMOS (Low Voltage Battery Operated CMOS) which operates with a DC power supply of 2.8 V plus or minus 0.8 V, are being prepared by JEDEC at this time. Each of these standards specify logic level values for inputs (VIH and VIL) and outputs (VOH and VOL). VIL is the maximum voltage at the input of the input buffer that will be recognized as logical zero. VIH is the minimum voltage level at the input of the input buffer that will be recognized as logical one. In a CMOS fabrication process output voltages generally range from ground to the maximum supply voltage. Thus for 3.3 V CMOS the typical logic levels are 0 V to represent logical zero and 3.3 V to represent logical one. In 5 V CMOS the typical logic levels are 0 V to represent logical zero and 5 V to represent logical one. However, in TTL fabrication the typical logic levels are 0.4 V to represent a logical zero and 2.4 V to represent a logical one. It is generally desirable to design a system with one type of logic family with similar logic levels. However due to the lengthy development cycle of integrated circuits, it may be a few years before notebook and hand-held computer designers have all the components necessary to design a complete system operating with only a 3.3 V DC power supply. Presently most floppy disk and hard disk controller integrated circuits that interface with the ISA or EISA bus require a 5.0 V power supply. Most flat panel and CRT Monitor display controllers require a 5.0 V power supply as well. Presently most microprocessors and DRAMs require a 5.0 V power supply to operate.

A system designer may need to design a system that operates with devices using a mixed set of DC power supplies. For example the designer may desire to design a system using a 3.3 V memory, a 5.0 V ISA bus, and internal core logic operating with a 3.3 V power supply. Hence there is a need for integrated circuit components that operate internal core logic using a 3.3 V power supply to conserve power and can simultaneously interface with other system components that generate 5 V CMOS, TTL, 3.3 V CMOS, or LVTTL logic levels from their respective DC power supplies.

In both mixed-voltage and low-voltage-only systems it is sometimes necessary to overdrive a bidirectional pin (also referred to as an Input/Output pin) with an input voltage that is greater than the DC supply voltage for the electronics of that bidirectional pin. For example assume the DC supply voltage is 3.3 V. This device may have to receive an input signal that reaches a value of 5 V from another device that has a DC supply voltage of 5 V. It is also possible that transmission line effects will cause the input voltage to ring above 3.3 V. In any case, it is desirable that power is not excessively consumed and that electronic components are not damaged.

Some prior-art methods for interfacing components of mixed DC supply voltages (also referred to as multiple DC supply voltages) to generate various logic levels use external components, such as diode clamps or voltage translators. Other prior-art methods use open-collector or open-drain output buffers that require an external pull-up resistor. These methods consume power because of extra current drawn from one of the DC supplies. Furthermore, many prior-art methods consider only unidirectional signals and not bidirectional signals, such as those within a data bus. Also such external components use space that is often very valuable, such as within a portable computer. Such additional components also reduce the reliability of a system.

This overdrive or overvoltage condition input at a pin of an integrated circuit was thought to be resolved by the PN junctions of the output transistors or the input protection diodes for an input only pin. Normally these diodes were reversed biased and had no effect on the electronic operation. However if the voltage applied to the pin becomes greater than the DC supply for that pin the diode forward biases. The diode then sinks current from the overvoltage source in order to reduce and maintain the amplitude at approximately 0.6 V above the DC supply voltage. This input protection diode current increases power consumption. In systems that use mixed DC voltage power supplies the input protection diode current can be considerable and cause damage to electronic circuits. In the case of CMOS devices excessive input protection diode current can lead to an effect called "latch-up". Thus, in low voltage (low power) CMOS systems it is desirable that a different approach to handle overvoltage conditions and mixed DC voltage power supplies be found. This would reduce power consumption and decrease the potential for circuit damage.

Figure 1:
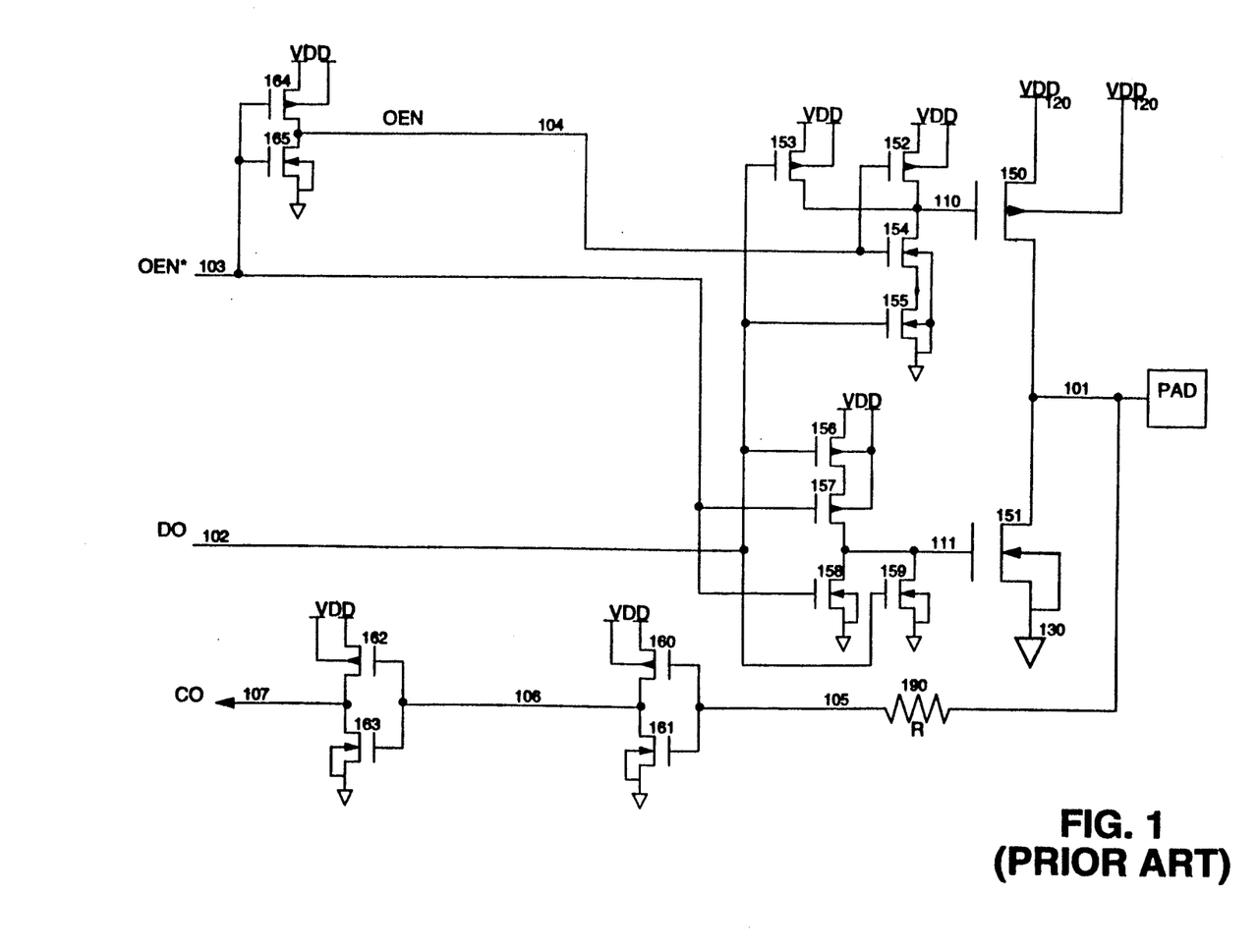
FIG. 1 shows schematic diagram of a prior-art CMOS bidirectional I/O buffer.

FIG. 1 represents the schematic of a prior-art CMOS bidirectional I/O buffer. In this case the pin of the integrated circuit has a P-type transistor pull-up 150. Thus, a separate input protection diode is not needed because the PN junction between the transistor drain and the n-well (or n substrate as the case may be) of the P-type transistor 150 is a natural diode. This diode is reverse biased for input voltage levels below the DC supply voltage VDD.

Assume that the I/O buffer of FIG. 1 is in an input mode. Assume that the DC supply voltage VDD 120 is set to 3.3 V. If the input voltage tries to overshoot or ring above VDD+0.6 V, the diode between the P-type transistor drain and substrate will sink current and increase power consumption.

Now assume VDD 120 is set to 5.0 V and the I/O buffer is in the input mode such that the output buffer is tristated. Assume that 3.3 V CMOS logic level signals are input to the PAD at node 101 where a logical one is represented by a voltage level of 3.3 V. The inverter that consists of transistors 160 and 161 has 3.3 V applied to their respective gate connections. Because VDD is set to 5 V and 3.3 V is applied to the gates of transistors 160 and 161 both transistors are in their on state. In this case each transistor is conducting and causes a current to flow from VDD to Ground (also referred to as VSS). In this document this current is referred to as a crowbar current and becomes nearly zero when either transistor 160 or 161 reach an off state. The off state for transistor 160 is reached when the input voltage at the PAD is above a value of VDD minus one P-type transistor threshold (VDD-VTP). The off state for transistor 161 is reached when the input voltage at the PAD is below a value of one N-type transistor threshold (VTN). Thus it is desirable to eliminate the crowbar current to decrease power consumption while supporting mixed logic level signals.

The prior-art tristate output buffer consists of a P-type power transistor 150, an N-type power transistor 151, a NAND gate pre-driver (consisting of transistors 152, 153, 154, 155), and a NOR gate pre-driver (consisting of transistors 156, 157, 158, and 159). Signal OEN* 103 is a signal from the core logic that tristates the power transistors 150 and 151. The "*" after a signal name represents that the signal is active low. Thus OEN* is an active low signal. In the case that the output buffer is tristated OEN* is logical one. OEN* is inverted by the inverter consisting of transistors 164 and 165 to generate OEN signal 104. If OEN* is a logical one OEN is a logical zero. OEN* is input to the NOR pre-driver at transistors 157 and 158. In this case OEN* is a logical one and forces the NOR output 111 to be a logical zero. Thus, transistor 151 is turned off because the gate voltage is 0 V. OEN 104 is input into the NAND pre-driver at transistors 154 and 152. In this case OEN is a logical zero and the NAND output 110 is forced to a logical one. Thus transistor 150 is turned off because the gate voltage is VDD volts. For the case that OEN* is a logical one, power transistors 150 and 151 are both off thereby tristating the output buffer.

In the case that the output buffer is turned on and not tristated, OEN* 103 is a logical zero. OEN 104 is a logical one. The NAND pre-driver is enabled and acts like an inverter of DO signal 102. Similarly the NOR pre-driver is enabled and acts like an inverter of DO signal 102. If DO 102 is a logical one, both the NAND pre-driver output 110 and the NOR pre-driver output 111 are logical zero. This turns on transistor 150 and keeps transistor 151 turned off. The PAD output 101 is charged towards VDD to represent a logical one. In the case that DO 102 is a logical zero, both the NAND pre-driver output 110 and the NOR pre-driver output 111 are logical one. This turns on transistor 151 and keeps transistor 150 turned off. The PAD output 101 is discharged towards Ground to represent a logical zero.

To conserve power the core logic that generates the signals OEN* 103 and DO 102 may have the power supply reduced. With the reduced power supply, the voltage representing binary logical values for OEN* and DO may be reduced to a range of 0 V to 3.3 V. The logic one value represented by 3.3 V is insufficient to properly drive an output buffer with a 5 V power supply. The 3.3 V causes crowbar currents in the output buffer. The PAD voltage levels are reduced from the normal range of 0 to 5 V. The rise, fall, and propagation times are greatly effected by the core logic voltage difference. Therefore it is desirable that the core logic with a different supply voltage be able to properly drive an output buffer.

Please note in the figures that wires crossing over do not connect unless the cross-over is highlighted by a darkened circle such as that at node 110. Wires that join at a "T" are understood to represent a connection and may also be highlighted by a darkened circle. Input protection resistor 190 is used to protect the gate oxide of transistors 160 and 161 from static charges that suddenly occur from handling a device. The resistor absorbs some of the energy that is transferred into the integrated circuit from an external source.

BRIEF SUMMARY OF THE INVENTION

This invention describes the design and implementation of a low power CMOS bidirectional I/O buffer that translates low voltage core logic level signals into the highest logic level signals to drive the final output stage which outputs a selectable logic level signal. The invention further translates input signals of a variety of logic levels into low voltage core logic level signals. In either case, AC and DC power consumption is minimized in a mixed power supply environment that requires voltage translation to represent the proper binary logic levels.

It is an object of the invention to decrease power consumption for a system that supports multiple DC voltage supplies.

It is a further object of the invention to bidirectionally translate low voltage logic level signals into higher voltage logic level signals.

It is a further object of the invention to minimize power consumption from the bidirectional translation of logic level signals.

It is a further object of the invention to support multiple DC voltage supplies.

DETAILED DESCRIPTION OF THE PREFERRED EMBODIMENT

The present invention includes a method and apparatus for a low power CMOS bidirectional (input and output or I/O) device typically located at bonding pads on I/O pins of integrated circuits. In the case of driving signals out of an IC, the invention can translate internal low voltage logic signals into various logic level output signals. In the case of receiving signals, the invention can translate various logic level input signals into internal low voltage logic level signals. In either case power consumption is minimized by the invention in order to maximize the operating time for a battery operated portable system.

The invention ideally supports a system with mixed voltages. In mixed voltage systems, a bidirectional data bus has various logic level signals present because of other DC supply voltages used to operate components interfacing with the data bus. The invention accepts various logic level inputs from these components and reduces normal power consumption associated with receiving the various logic levels. At the same I/O PAD the invention will output user selectable logic levels by an appropriate choice of DC supply voltage to the invention. Within the same device, the invention further provides the capability to output at a group of pins one set of logic levels and to output at another groups of pins a different set of logic levels.

Figure 2:
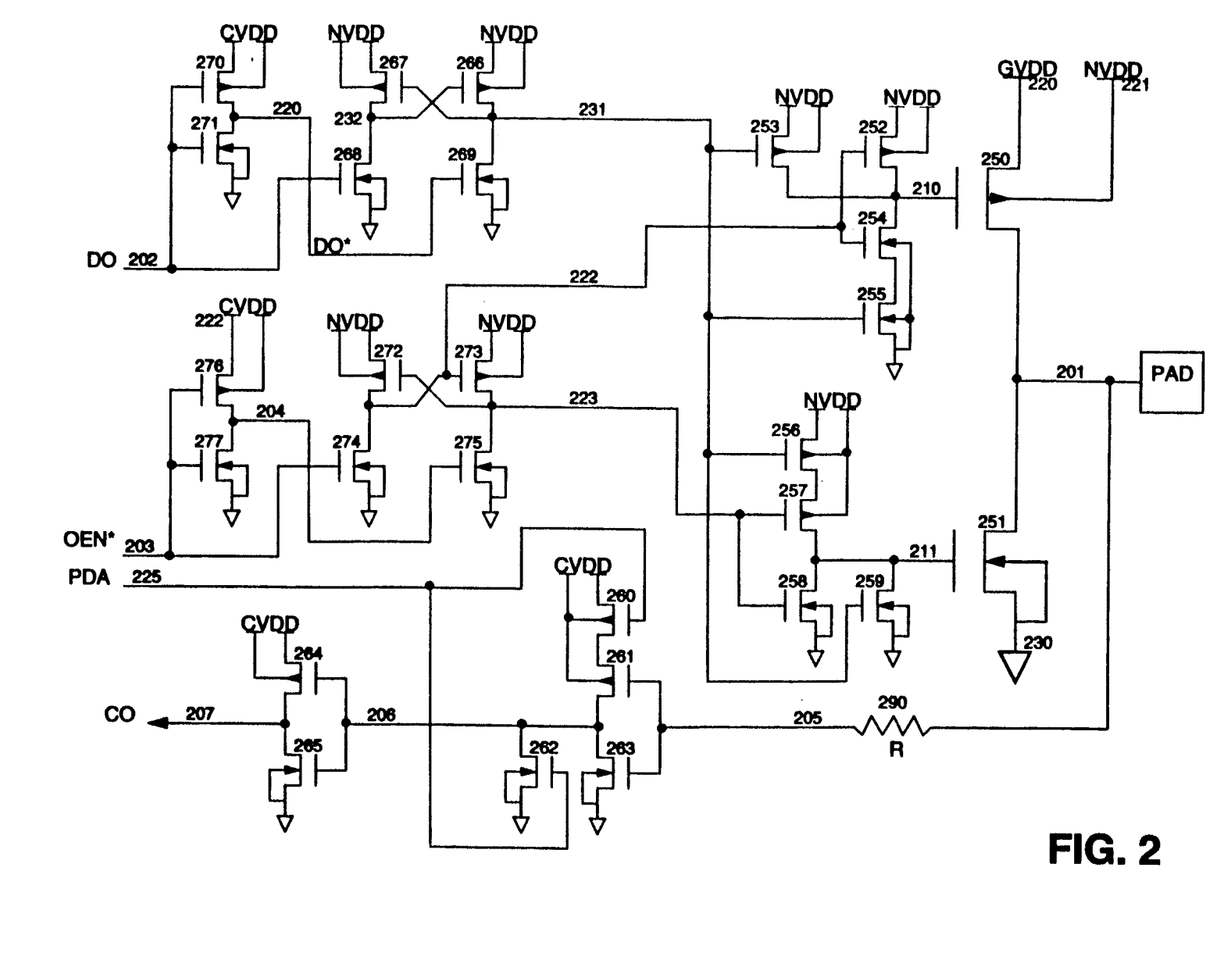
FIG. 2 shows a schematic diagram of a bidirectional I/O buffer that provides low power consumption for systems with mixed DC supply voltages.
Figure 6:
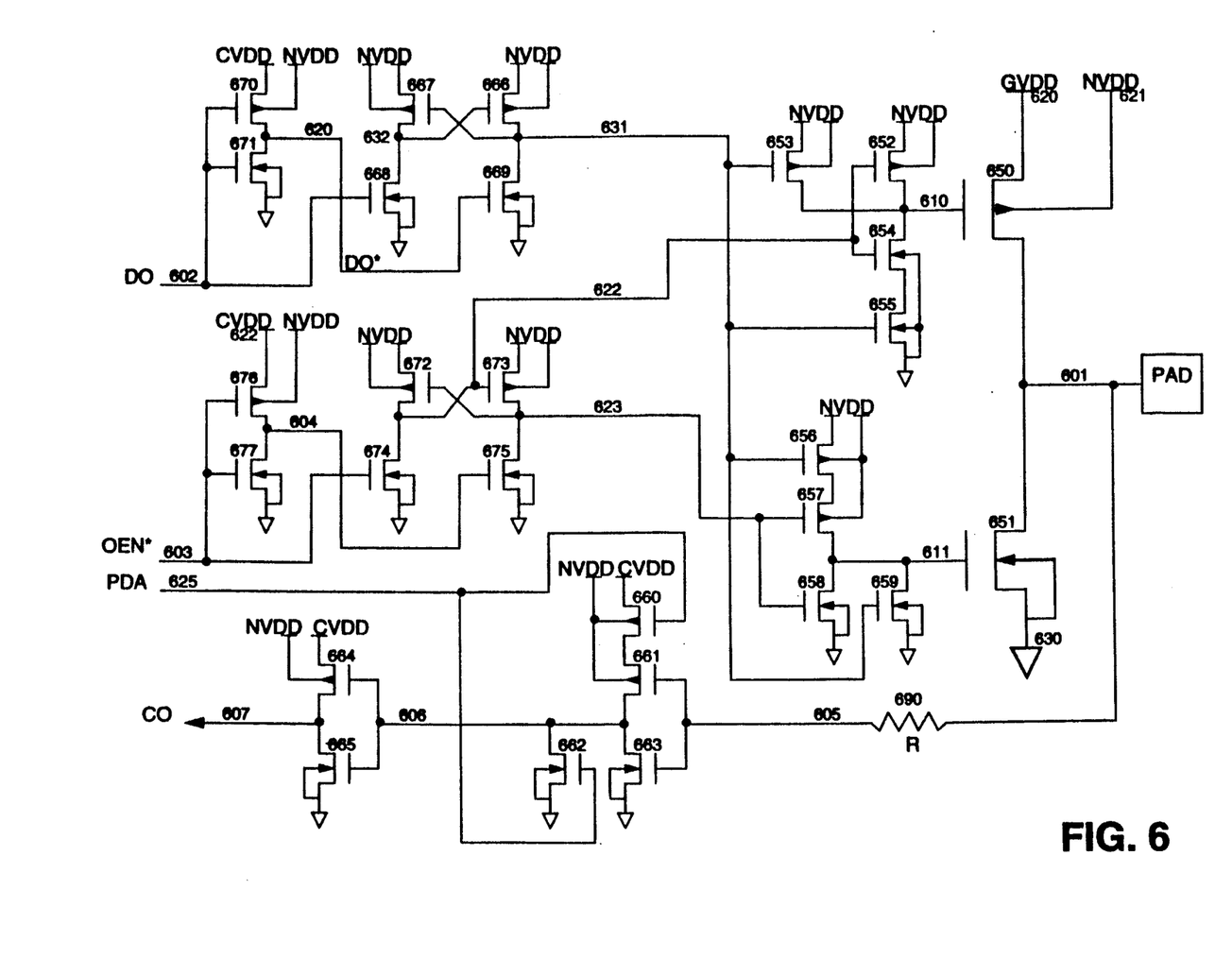
FIG. 6 illustrates the schematic diagram of FIG. 2 in the case that the fabrication process is of a type that provides a p-well for the N-type transistors and an n-substrate for the P-type transistors.

The invention can be manufactured in different CMOS (Complimentary Metal Oxide Semiconductor) processes. FIG. 2 illustrates the invention manufactured in a CMOS process that either contains an n-well or both an n-well and a p-well (also known as twin-tub). FIG. 6 illustrates the invention manufactured in a CMOS process that contains only a p-well such that the n minus substrate is tied to the DC supply voltage NVDD. P-type transistors (also referred to as PFET or PMOS transistor) are represented by the transistor symbol of transistor 270 in FIG. 2. N-type transistors (also referred to as NFET or NMOS transistor) are represented by the transistor symbol of transistor 271 in FIG. 2. The reference to P-type or N-type transistor is not generally used in the text but can be discerned from the figures.

The N-type transistors are assumed to have their respective P substrate or P well (twin tub) tied to Ground or 0 V as indicated by the transistor symbol. The symbol for ground is the triangle symbol at node 230 of FIG. 2. Assume that each N-type transistor that has a connection to this ground symbol is tied to Ground. The power source for Ground is sometimes referred to as the negative power supply or VSS and in digital CMOS circuitry it is usually represented by 0 V.

The bidirectional or I/O buffer consists of two main elements. The first is an input buffer consisting of transistors 260 through 265 in FIG. 2. The second element is an output buffer consisting of transistors 250 through 259 and 266 through 277. Each of these elements is connected together at a PAD at node 201 in FIG. 2. Signals received at the PAD by the invention are input into the input buffer. Signals output at the PAD by the invention are output from the output buffer. The PAD is represented by a square in FIG. 2. The PAD is a bonding surface that allows for a wire from an integrated circuit package to connect a pin of the integrated circuit package to the electronics within a semiconductor substrate.

INPUT BUFFER

The design of the first stage of the input buffer is similar to the design of an inverter that can receive various input logic levels. For the Input buffer to translate 5 V CMOS logic level input signals, 3.3 V CMOS logic level input signals, and TTL logic level input signals into logic signals the core logic understands, we desire the characteristics of a CMOS inverter with a switching threshold designed to worst case conditions. TTL families generally provide the worst case conditions such that VIH=2.0 V and VIL=0.8 V for the LVTTL DC supply voltage of 3.3 V. However, Low Voltage Battery Operated CMOS specifies that VIH=1.4 V and VIL=0.4 V for the minimum DC supply voltage of 2.0 V. By designing for LVTTL we will show that LVBO CMOS conditions are satisfied as well. To satisfy LVTTL conditions it is desirable that the input buffer switching threshold be set at the midpoint between 2.0 V and 0.8 V or 1.4 V for a DC supply voltage of CVDD. CVDD will typically be 3.3 V to match the LVTTL DC supply voltage. Using SPICE analysis, the inverter switching threshold is set by sizing the width and length of the P-type and N-type transistors of the first stage of the input buffer. The inverter switching threshold is not an absolute voltage but varies in proportion to the DC supply voltage. As the DC supply voltage decreases from 3.3 V to 2.0 V the inverter switching threshold decreases as well. JEDEC specified that LVBO CMOS can reach a minimum DC supply voltage of 2.0 V. SPICE analysis of this invention shows that the input buffer operates as low as the LVBO CMOS supply voltage of 2.0 V and will properly receive the appropriate logical zero or logical one for respective logic levels of VIL=0.4 V and VIH=1.4 V. Therefore by designing the input buffer for LVTTL logic levels and a DC supply voltage of 3.3 V, the LVBO CMOS logic levels are satisfied as well. While an inverter may be ideal, it is desirable to turn off an input buffer when not reading signals from the PAD. This reduces power consumption. A NAND or NOR gate, designed to model the switching characteristics of an inverter as described above, can be used to selectively turn on and off the first stage of the input buffer.

In FIG. 2 the first stage of the input buffer consists of a NOR gate (transistors 260, 261, 262, and 263). This stage is designed to simulate an inverter when it is enabled by Power Down (PDA) signal 225. The internal core logic voltage supply (CVDD) is typically 3.3 V which is the power supply to the first stage of the input buffer at transistor 260. Thus when the first stage is enabled it acts like an inverter with a switching threshold 1.4 V designed to meet LVTTL logic levels and a DC supply voltage of 3.3 V. Recall that LVTTL and LVBO CMOS are worst case conditions for logic levels and that the design of an input buffer with a 1.4 V switching threshold for a 3.3 V DC supply voltage satisfies these requirements. Because the 5 V CMOS specifications for VIH and VIL is less stringent than the LVTTL requirements, the 1.4 V switching threshold for an input buffer with a DC supply voltage of 3.3 V will meet the 5 V CMOS logic levels. Therefore the switching threshold of 1.4 V satisfies many external voltage requirements including 5 V CMOS, 3.3 V CMOS, TTL, LVTTL, and LVBO CMOS. Please note that when the input buffer is operational power is more greatly consumed by the TTL and LVTTL specifications for VIL and VIH because of crowbar currents. Providing rail to rail levels (or within 10% of each power supply rail) at the input of the input buffer conserves power in its operational mode because either a P-type transistor or an N-type transistor is in its off state.

The second stage of the input buffer is an inverter consisting of transistors 264 and 265 in FIG. 2. This inverter serves the same function as the inverter consisting of transistors 162 and 163 in FIG. 1. This inverter ensures polarity presented to the core logic at CO output 207 is the same as the PAD polarity. It further provides the desired drive for CO output 207 to overcome internal capacitance within a desired time period. At output CO 207 in FIG. 2 the voltage level representing a logical one is CVDD volts because the input buffer's power supply is CVDD at transistor 264. Therefore, the input buffer executes the translation for a logical one from various logic levels at its input into CVDD volts at CO output 207. CO output 207 is an active high signal with logic levels translated from those at the PAD. CO is sent internally to the core logic of a device to use the signal received at the PAD to perform various functions within a device that contains the invention. This second stage of the input buffer consisting of transistors 264 and 265 may be optional if a weak active low signal is acceptable to the internal core logic. Thus a signal directly from the first stage of the input buffer at node 206 may be driven into the core.

In the prior-art the first stage of an input buffer is an inverter. FIG. 1 illustrates the prior-art inverter by transistors 160 and 161. This inverter is constantly enabled and consumes considerable AC power upon switching from rail to rail. Further if the voltage levels are not rail to rail but are TTL logic levels of VIH=2.0 V and VIL=0.8 V, the inverter consumes even more power from both AC switching and DC power due to crowbar currents. Power consumption is even greater If an inverter input is allowed to float. In this case there is no guarantee as to what voltage level is applied to the inputs of the inverter. The inverter may toggle randomly from high to low. Thus the inverter and its respective transistors pass through the linear region of a transistor's functional curve such that it draws current and consumes power. Alternatively if the inverter input is floating, the input could establish a DC level where large crowbar currents consume power. Even pins that are properly receiving signals consume power. If input signals are not needed by the core logic then an inverter driven from rail to rail is consuming AC switching power needlessly. Thus when not reading signals into the core logic, the first stage of the input buffer can be set (referred to as disabled) to ignore all signals at the PAD, including signals that are floating, such that power consumption can be reduced.

In the invention the first stage of the input buffer is a NOR logic gate which can be set such that it conserves power. PDA signal 225 selectively sets the first stage of the input buffer when signals are not being received by the invention. PDA signal has a voltage of CVDD as its high logic level. If PDA signal is high it forces the CO output 207 to be high, regardless of the signal at the pad. In this case the pad level could be floating in a range of values and not disturb the logic level within the device. This also minimizes power consumption for pads that actually do float.

This power savings is accomplished in the invention by the use of a NOR gate (consisting of transistors 260, 261, 262, and 263 in FIG. 2) as the first stage of the input buffer. If input 205 of the NOR gate floats, PDA input 225 when set high forces the NOR gate output into a fixed state so that it does not actively draw power. When reading signals from the PAD, PDA signal 225 is low and does not affect the logic values received by the input buffer. The PDA signal 225 can control all pins or selected groups of pins within an integrated circuit with the use of either soft-ware (control register bit(s)) or hard-ware (a dedicated pin).

Those skilled in the art will recognize that a NAND gate can be used in place of the NOR gate. This reduces power consumption by ignoring signals at the pad and forcing the NAND output to a fixed state. In this case CO output 207 is forced low if the second input to the NAND, input enable (IEN), is set low.

OUTPUT BUFFER

In general the output buffer translates low level voltage signals from the core logic into the desired logic level signals at the PAD. In FIG. 2 the desired output level is selected by setting GVDD 220 to the appropriate DC supply voltage such as 5 V or 3.3 V. Translation first starts by converting the core logic level signals into the highest power supply level of the system. The highest power supply voltage must be applied as the NVDD connection for transistors in FIG. 2. Thus the core logic level signals DO 202 and OEN* 203 must first be converted to the NVDD level in the system.

To select the desired output logic level, the final P channel transistor 250 has GVDD tied to its source 220. However the N-WELL of transistor 250, is tied to NVDD for reasons that are discussed below. Other logic gates before the final output stage of transistors 250 and 251 are also powered by NVDD. If this were not the case, the voltage present at gates 210 and 211 of transistors 250 and 251 would not provide the proper drive levels to meet output specifications of VOH, VOL, rise, fall, or propagation delay.

Signal DO 202 is the data that is desired to be transferred from the core logic out to the PAD. OEN* signal 203 represents the output enable signal that tristates the output when OEN* is high. The * after the signal name represents that the signal is active low. Thus, the invention ensures that if OEN* is low, the logic value asserted at DO 202 is output to the PAD. In the case that OEN* is high, the final stage of the output buffer is disabled. Transistors 250 and 251 are off and do not source or sink current into or out of the PAD.

Voltage Translation

Voltage levels of the core logic signals DO and OEN* need to be translated into voltage levels that may be used to drive the final stage of the output buffer. Logical zero (also referred to as a low logic level) is represented by 0 V and does not require translation. However logical one (also referred to as a high logic level) of signals DO and OEN* is represented by a voltage of CVDD which must be translated into a voltage level of NVDD. This is accomplished by the use of voltage translators. In FIG. 2 the inverter consisting of transistors 270 and 271 in conjunction with the cross wired transistors of 266, 267, 268, and 269 represents the voltage translator for the signal DO. The inverter consisting of transistors 276 and 277 in conjunction with the cross wired transistors of 272, 273, 274, and 275 represents the voltage translator for the signal OEN*.

The N-type transistor threshold in a typical semiconductor fabrication process varies from 0.6 to 1.2 V. The N-type transistors 268, 269, 274, and 275 will turn on for a voltage applied to their respective gates that is greater than the N-type transistor threshold voltage. This places an operational limit on the core voltage CVDD such that it must be greater than the N-type transistor threshold voltage of the specified semiconductor process. Typical maximum N-type transistor threshold voltage is 1.2 V. Thus the voltage translators will operate correctly with any CVDD DC supply voltage that is greater than 1.2 V. This allows chips to be designed with voltage translators that operate with a CVDD DC supply voltage from below 2.0 V up to NVDD volts, which is typically 5 V or 6 V.

N-type transistors 268, 269, 274, and 275 and P-type transistors 272, 273, 274, and 275 are respectively rationed such that for a worst case value of CVDD equal to 3.0 V and a worst case value of NVDD equal to 5.5 V the N-type transistor (such as transistor 268) can overcome the current supplied by the P-type transistor (such as transistor 267) to flip the voltage translator to the opposite state. This assures that the design of the voltage translator can translate 3.3 V CMOS logic level into 5 V CMOS logic levels or 3.3 V CMOS logic levels into 3.3 V CMOS logic levels or 5 V CMOS logic levels. Thus, CVDD can be set to a 3.3 V DC supply voltage and NVDD can be set to a 5 V DC supply voltage, or CVDD can be set to a 3.3 DC supply voltage and NVDD can be set to a 3.3 V DC supply voltage, or CVDD can be set to a 5 V DC supply voltage and NVDD can be set to a 5 V DC supply voltage, all with power supply tolerances of plus or minus ten percent and in each case the voltage translator properly translates the respective logic levels.

The cross wired transistors of 272, 273, 274, and 275 logically operate similar to a pair of cross coupled inverters in a RAM cell or latch. The signal DO is inverted by transistors 270 and 271 to generate DO* signal 204. The signals DO and DO* driving opposites sides of the cross wired transistors tip the balance of the logical state of the cross wired transistors. For example assume initially that DO is a logical zero such that DO signal is 0 V. Therefore DO* initially is a logical one such that the DO* signal is CVDD volts. P-type transistors 267 and 266 are tied to the NVDD voltage supply at their source connection so that output nodes 231 and 232 vary in a range from 0 V to NVDD volts. Thus the initial states of DO and DO* set the cross coupled transistors such that node 232 is NVDD volts and node 231 is 0 V. For DO to logically change state from a zero to a one, signal DO transitions from 0 V to CVDD volts while DO* transitions from CVDD volts to 0 V. As DO transitions from 0 V to CVDD it begins to turn on transistor 268 such that node 232 begins to transition from NVDD volts to 0 V. Since DO* is transitioning from CVDD to 0 V this turns off transistor 269 and allows node 231 to transition from 0 V to NVDD volts.

For DO to logically change state from a one to a zero, signal DO transitions from CVDD volts to 0 V while DO* transitions from 0 V to CVDD volts. As DO transitions from CVDD volts to 0 V it begins to turn off transistor 268 such that node 232 is allowed to transition from 0 V to NVDD volts. Since DO* is transitioning from 0 to CVDD volts this turns on transistor 269 and causes node 231 to transition from NVDD volts to 0 V. In this manner, logical zero represented by 0 V and logical one represented by CVDD volts within the core logic are respectively translated into 0 V and NVDD volts. Note that node 231 represents the logical equivalent of DO and is connected to the tristate output buffer NAND gate and NOR gate pre-drivers to drive the logic state out to the PAD.

The voltage translator for OEN* signal 203 is nearly identical and operates in the same way. The only difference is that both outputs of this voltage translator are used to enable or disable the tristate output buffer. Note that node 222 logically represents OEN and node 223 logically represents OEN*.

Power Transistors

Figure 7:
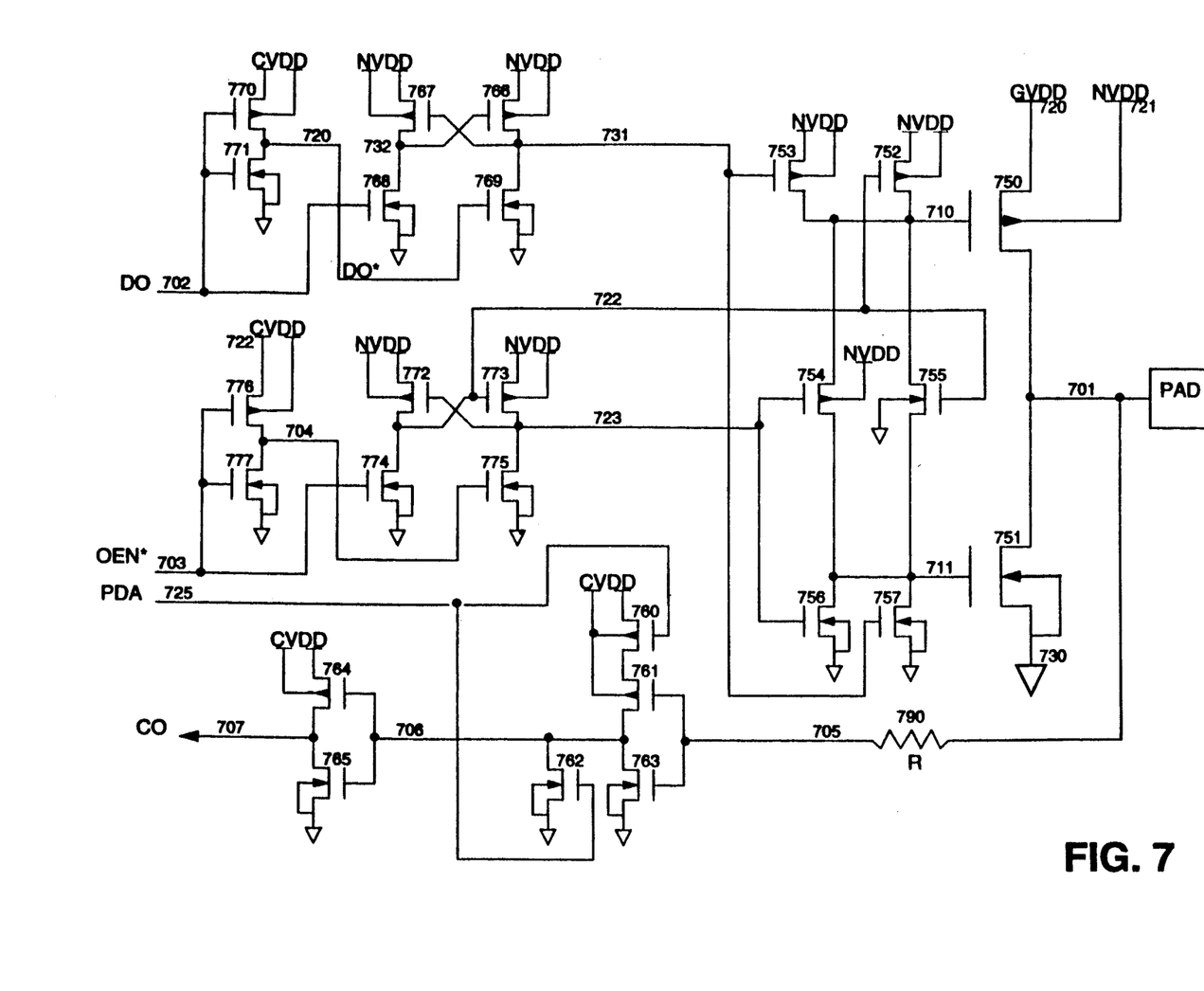
FIG. 7 illustrates an alternate embodiment of the invention.

Outputs of the two voltage translators are input to a NAND gate, consisting of transistors 252, 253, 254, and 255, and a NOR gate, consisting of transistors 256, 257, 258, and 259. The NAND gate controls the power P-type pull-up and the NOR gate controls the power N-type pull-down. These two logic gates are the pre-drivers for the power transistors and facilitate the tristate mechanism as well as provide the correct polarity of DO to the PAD. The NAND gate is also referred to as the NAND pre-driver. The NOR gate is also referred to as the NOR pre-driver. An alternative embodiment of the invention replaces the NAND and NOR gate pre-drivers with transistors 752 through 757 as illustrated by FIG. 7.

Figure 3:
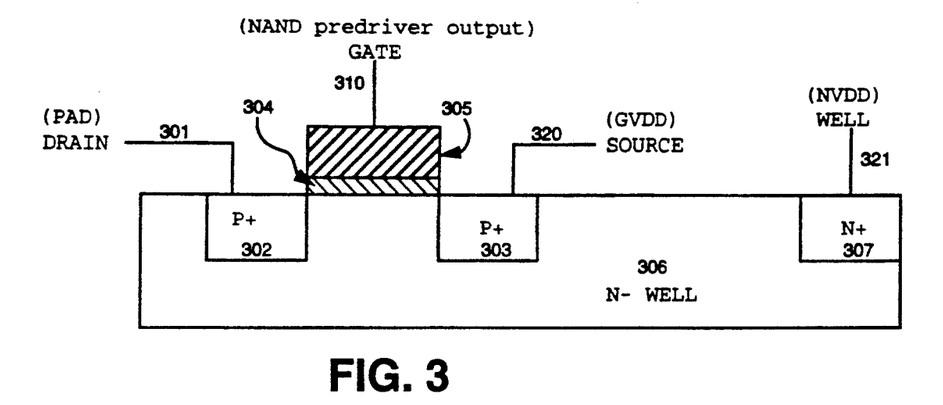
FIG. 3 illustrates a cross section of a P-type transistor in a silicon substrate.
Figure 4:
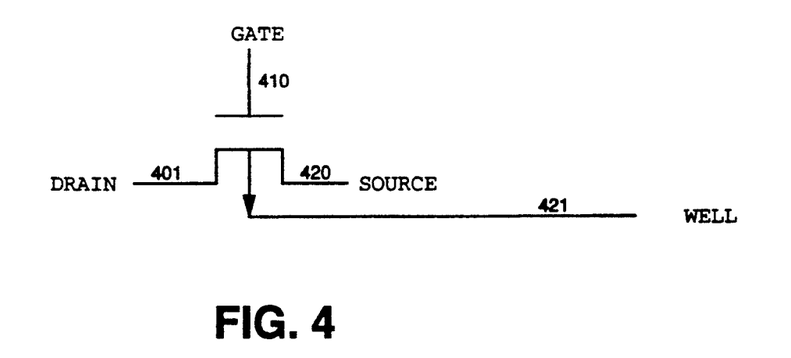
FIG. 4 illustrates the schematic representation of the P-type transistor as illustrated by FIG. 3.

The P-type power transistor 250 can be illustrated by FIG. 3 and FIG. 4. FIG. 3 shows the cross section of the transistor in a silicon substrate. The well connection 321 is tied to NVDD 221 of FIG. 2. The source connection 320 is tied to GVDD 220 of FIG. 2. The gate connection 310 is tied to the output 210 of the NAND pre-driver. The drain connection 301 is tied to the PAD at output 201. FIG. 4 represents the transistor schematic of FIG. 3.

Recall that NVDD is the highest voltage power supply within the system. The source, GVDD 220, of transistor 250 may be less than or equivalent to NVDD. The power supplied to the pre-driver NAND and NOR gates is NVDD. Thus this level of voltage can be applied to gates 210 and 211 of the power transistors 250 and 251. Since NVDD is greater or equal in voltage to GVDD the NAND pre-driver will correctly drive the P-type power transistor into the appropriate switching region. This is the case regardless whether GVDD is set to 3.3 V or 5 V so long as it is less than or equal to NVDD. The N-type power transistor operates similar to the prior-art method of switching characteristics.

Assume that in FIG. 2 the overall I/O buffer is in an input mode such that the output buffer is tristated and the input buffer is enabled. The P-type power transistor is configured in this invention so that its n-well is tied to NVDD. Inherent to the P-type transistor are diodes between the drain and n-well as well as the source and n-well. The drain diode is illustrated in FIG. 3 at the junction of the P+ 302 and the N− WELL 306. The source diode is illustrated by the junction of the P+ 303 and the N− WELL 306. Both of these diodes will not turn on (forward bias) until the drain 301 or source 320 is typically 0.6 V greater than the voltage tied to the WELL 321. The drain diode is normally reversed bias so that it will not draw current from the pin until the voltage on the PAD is greater than a diode threshold above NVDD. For example if NVDD is 5 V and the diode threshold is 0.6 V, the diode will not draw current until the voltage at the PAD is 5.6 V. Recall that the invention requires that NVDD be the highest voltage power supply. Thus GVDD is less than or equal to NVDD which keeps the source diode in a reverse bias such that only leakage currents consume power. With the I/O buffer in an input mode the NAND pre-driver has tristated transistor 250 so that the gate voltage is set to NVDD. This keeps the P-type power transistor turned off for PAD voltages up to NVDD plus the P-type gate threshold voltage. Therefore, GVDD may be set to a range of voltages below NVDD, such as 3.3 V, and will not effect power consumption. In general, this configuration of the P-type power transistor, allows the PAD voltage to reach a level of NVDD plus a diode threshold without an increase in power consumption. This configuration of the P-type transistor is an element of the invention that conserves power for a system of mixed power supply voltages.

In comparison to the invention, the prior-art P-type power transistor's (150) n-well and source are both tied to VDD (120) as illustrated in FIG. 1. If the PAD input voltage is above VDD, the drain diode, represented by the junction of P+302 and the N-WELL 306, is forward biased. If the PAD input voltage is 0.6 V or more above VDD, the diode draws current from the external device driving the PAD whereby power is consumed. Also the prior-art P-type power transistor can not source a different power supply voltage other than VDD. In the case that VDD is set to 3.3 V, the PAD can not accommodate signals that are normally driven to 5 V without considerable power consumption.

Thus the invention provides bidirectional voltage translation and low power consumption for signals input to an integrated circuit that may be greater than the desired output logic levels.

ADVANTAGES

This invention supports a bidirectional data bus that can contain various logic level signals without extra consumption of power or external components. For example the invention can support a data bus that uses both 3.3 V CMOS logic levels as well as 5 V CMOS logic levels. In the prior-art of FIG. 1 (and also in the RCA CD40116 data sheet) only single logic levels are supported. Consideration was not given to support at the same bidirectional I/O pin multiple logic level families such as 3.3 V CMOS logic levels, 5 V CMOS logic levels, and TTL logic levels. These references do not teach that the n-well and source of the P-type power transistor within an I/O buffer at a bidirectional pin (transistor 250 in FIG. 2) could be separated to support multiple logic levels and reduce power consumption.

For example assume a first peripheral CMOS part operates with a DC supply voltage of 5 V. A second peripheral CMOS part operates with a DC supply voltage of 3.3 V. The device containing the invention has the GVDD DC supply voltage set to 3.3 V. The NVDD DC supply voltage is set to 5 V. CVDD DC supply voltage is set to 3.3 V. In the case that the first peripheral CMOS device drives the data bus it attempts to output a logical one at a 5 V level. The device containing the invention allows a 5 V logical one without consuming power. However, the second peripheral CMOS device operating at 3.3 V without the invention will attempt to clamp the data bus at approximately 4 V and sink current from the first peripheral CMOS device by means of its input protection diodes. In the case that the device containing the invention is driving the data bus, a logical one will be represented by an output of 3.3 V. This properly drives the second peripheral device such that its input buffer is at its ideal value without being overdriven where its input protection diodes would turn on and sink current. The first peripheral device will consume some power because it does not have its input driven to the ideal value of 5 V. This is similar to the case that the second peripheral CMOS device is driving the data bus. Note that most 5 V CMOS components are designed to receive TTL logic levels (VIH=2.0 V, VIL=0.8 V) and thus the first peripheral device will recognize that 3.3 V represents a logical one at its input. In this manner, the device containing the invention can interface with peripheral components operating with different DC supply voltages.

PADs can be selectively grouped on the same integrated circuit to support different output voltages at different ports of the chip. For example in FIG. 5 the invention (I/O Buffer) is placed at PADs 502 through 509, 511 through 518, 520 through 527, and 529 through 537. PADs 502 through 509 have their OEN* signals tied together to OEN1* and their PDA signals tied together to PDA1. PADs 511 through 518 have their OEN* signals tied together to OEN2* and their PDA signals tied together to PDA2. PADs 520 through 527 have their OEN* signals tied together to OEN3* and their PDA signals tied together to PDA3. PADs 529 through 537 have their OEN* signals tied together to OEN4* and their PDA signals tied together to PDA4. Recall that by lowering the power supply voltage such as from 5.0 V to 3.3 V decreases power consumption by approximately forty percent. Thus, assume CVDD is set to 3.3 V to conserve power and is distributed to all transistors connected to this supply. Assume GVDD1 (520) and GVDD3 (528) are set to 3.3 V while GVDD2 (519) and GVDD4 (538) are set to 5 V. Assume that the highest system voltage is 5 V and that NVDD is set to this value and distributed to transistors connected to this supply. GVDD1 is the positive power supply voltage to each I/O Buffer at bonding pads 502 through 509 such that their GVDD connections are tied to GVDD1. GVDD2 is the positive power supply to each I/O Buffer at bonding pads 511 through 518 such that their GVDD connections are tied to GVDD2. GVDD3 is the positive power supply to each I/O Buffer at bonding pads 520 through 527 such that their GVDD connections are tied to GVDD3. GVDD4 is the positive power supply to each I/O Buffer at bonding pads 529 through 537 such that their GVDD connections are tied to GVDD4. Thus I/O Buffers at bonding pads 511 through 518 and 529 through 537 will generate 5 V CMOS logic levels to external devices that are connected to the pins of the respective bonding pad. I/O Buffers at bonding pads 502 through 509 and 520 through 527 will generate 3.3 V CMOS logic levels to external devices that are connect to the pins of these respective bonding pads. Selectively grouping bonding pads similar to this manner allows the integrated circuit 501 to support multiple external logic levels on the same silicon die.

In the example above, enabling the input buffer and the output buffer at a group of pins that use the invention can be accomplished by an enable register 551 which can be set by software. The register contains bits that would turn on the output buffer of the respective groups of pins. The register bits represent the OEN1*, OEN2*, OEN3*, OEN4*, PDA1, PDA2, PDA3, and PDA4 enabling signals for the respective group of pins. Alternatively the output buffers or input receivers can be enabled by hardware by the use of enable input pins or by a control signal directly received from the core logic 550. The output buffer enable pins are represented by inputs received at bonding pads OEN1* (540), OEN2* (541), OEN3* (542), and OEN4* (543) in FIG. 5. Input buffers can be hardware enabled by an input buffer enable pin as well. For example PDA2 (547) is the input buffer enable pin for PADs 511 through 518.

Figure 5:
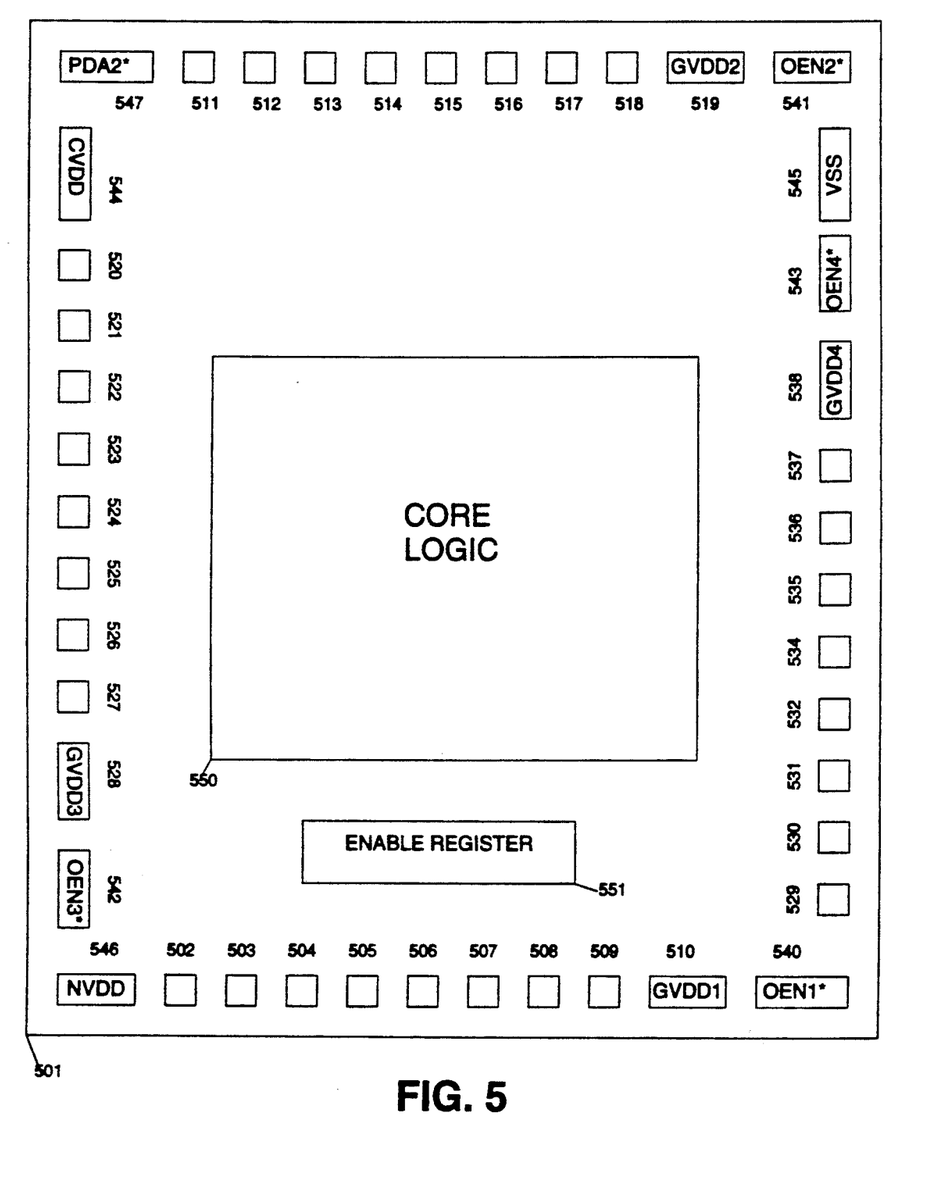
FIG. 5 illustrates an integrated circuit containing groups of the I/O Buffer as illustrated by FIG. 2 in order to support multiple voltage level outputs within the same integrated circuit.

The required DC supply voltages are also supplied to the bonding pads in FIG. 5. The highest level of DC supply voltage NVDD is supplied at bonding pad 546. The core logic DC supply voltage CVDD is supplied through bonding pad 544 into the core logic 550 as well as other areas of the integrated circuit where necessary. Ground or the most negative DC supply voltage is supplied through the VSS bonding pad 545. The output logic levels are selected for the group of I/O buffers by setting the appropriate supply voltage at GVDD1 (510), GVDD2 (519), GVDD3 (528), or GVDD4 (538) as discussed above.

While a preferred embodiment of the present invention has been disclosed and described in detail herein, it will be obvious to those skilled in the art that various changes in form and detail may be made therein without departing from the spirit and scope thereof.

We claim:

1. In an output buffer for connecting a CMOS chip having a circuit operating from a power supply at a first voltage to a second device operating from a power supply at a second voltage, wherein said output buffer includes a pair of voltage converters for converting data and output enable signals from the circuit of the CMOS chip to a signal voltage of the second device, and pull-up and pull-down transistors connected between the voltage convertors and a connection pad on the CMOS chip, with the pull-up transistor having a source connected to said second voltage, an improvement comprising:

connecting the voltage converters to a high voltage which is greater than or equal to the higher of said first and second voltages;

providing a connection from the N-well of the pull-up transistor to said high voltage, said N-well voltage connection being separate from said source voltage connection.

2. The output buffer of claim 1, wherein said first voltage is 3.3 V and said second voltage is 5 V.

3. The output buffer of claim 2, wherein the second device is a 5 V CMOS device.

4. The output buffer of claim 2, wherein the second device is a 5 V TTL device.

5. The output buffer of claim 2, wherein the second device is an LVBO CMOS device.

6. The output buffer of claim 1, wherein said first and second voltages are equal.

7. The output buffer of claim 6, wherein said first and second voltages are 3.3 volts.

8. The output buffer of claim 1, wherein said first voltage is greater than said second voltage.

9. The output buffer of claim 1, wherein said first voltage is less than said second voltage.

10. The output buffer of claim 1, wherein said high voltage is 12 volts.

11. An output buffer for connecting a CMOS chip having a circuit operating from a power supply having a first voltage to a device operating from a power supply having a second voltage, said output buffer comprising:

first voltage conversion means for converting a first output signal from said CMOS chip to a signal level associated with a high voltage, wherein said high voltage is greater than both of said first and second voltages;

second voltage conversion means for converting a second output signal from said CMOS chip to a signal level associated with said high voltage;

combining means for combining the output signals from said first and second voltage conversion means; and connection PAD means, on the CMOS chip, for connecting outputs of said combining means to said other device operating from said power supply at said second voltage.

12. The output buffer of claim 11, wherein said first output signal is a data signal, said second output signal is an enable output signal, and wherein said combining means combines converted data and enable output signals from said voltage conversion means to output a data signal subject to a pre-selected state of said enable output signal.

13. The output buffer of claim 12, wherein said output enable signal is set LOW to enable transmission of said data signal, and HIGH otherwise.

14. The output buffer of claim 11, wherein said combining means comprises:

a P-type pull-up transistor, having a gate receiving output signals from said first and second conversion means, a source connected to said second voltage, and an N-well connected to said high voltage; and a N-type pull-down transistor, having a gate receiving output signals from said first and second conversion means, a source connected to a ground, and a P-well connected to said ground.

15. The output buffer of claim 14, with said combining means further including:

a NAND-gate having a first input connected to said first voltage conversion means, a second input connected to a first output of said second voltage conversion means, and an output connected to said gate of said P-type transistor; and a NOR-gate means having a first input connected to said first voltage conversion means, a second input connected to a second output of said second voltage conversion means, and an output connected to said gate of said N-type transistor.

16. The output buffer of claim 11, wherein said first voltage conversion means comprises:

an inverter having an input receiving said first output signal from said CMOS chip; and cross-wired transistors, connected to said high voltage, having a first input connected to an output of said inverter, and a second input receiving said first output signal from said CMOS chip.

17. The output buffer of claim 16, wherein said output buffer is formed on a P-substrate and said inverter of said first voltage conversion means includes a P-type transistor having a source connected to said first voltage and an N-well connected to said first voltage.

18. The output buffer of claim 16, wherein said output buffer is formed on a N-substrate and said inverter of said first voltage conversion means includes a P-type transistor having a source connected to said first voltage and an N-substrate connected to said high voltage.

19. The output buffer of claim 16, wherein said cross-wired transistors comprise:
- a first transistor having a gate receiving said first output signal from said CMOS chip, said first transistor being of N-type and having a P-well connected to a ground;
- a second transistor having a source receiving an output of said first transistor, said second transistor being of P-type and having an N-well connected to said high voltage;
- a third transistor having a gate receiving an output of said first transistor, said third transistor being of P-type and having an N-well connected to said high voltage;
- a fourth transistor having a gate receiving an output signal from said inverter, said fourth transistor being of N-type and having a P-well connected to said ground, with said third transistor having a source connected to the output of said fourth transistor; and
- a first output line connected to said gate of said second transistor and to said third and fourth transistors.

20. The output buffer of claim 11, wherein said second voltage conversion means comprises:
- an inverter having an input receiving said first output signal from said CMOS chip; and
- cross-wired transistors, connected to said high voltage, having a first input connected to an output of said inverter, and a second input receiving said first output signal from said CMOS chip.

21. The output buffer of claim 20, wherein said output buffer is formed on a P-substrate and said inverter of said second voltage conversion means includes a P-type transistor having a source connected to said first voltage and an N-well connected to said first voltage.

22. The output buffer of claim 20, wherein said output buffer is formed on a N-substrate and said inverter of said second voltage conversion means includes a P-type transistor having a source connected to said first voltage and an N-substrate connected to said high voltage.

23. The output buffer of claim 20, wherein said cross-wired transistors comprise:
- a first transistor having a gate receiving said first output signal from said CMOS chip, said first transistor being of N-type and having a P-well connected to a ground;
- a second transistor having a source receiving an output of said first transistor, said second transistor being of P-type and having an N-well connected to said high voltage;
- a third transistor having a gate receiving an output of said first transistor, said third transistor being of P-type and having an N-well connected to said high voltage;
- a fourth transistor having a gate receiving an output signal from said inverter, said fourth transistor being of N-type and having a P-well connected to said ground, with said third transistor having a source connected to the output of said fourth transistor; and
- a first output line connected to said gate of said second transistor and to said third and fourth transistors and a second output line connected to said gate of said third transistor.

24. An output buffer for connecting a CMOS chip having a circuit operating from a power supply at a first voltage level to a device operating from a power supply at a second voltage, said output buffer comprising:
- a first voltage converter converting a data output signal from said CMOS chip to a signal level associated with a high voltage;
- a second voltage converter converting an enable output signal from said CMOS chip to a signal level associated with said high voltage;
- a NAND-gate receiving outputs from said first and second voltage converters;
- a NOR-gate receiving outputs from said first and second voltage converters;
- a P-type pull-up transistor, having a gate connected to said NAND-gate, a source connected to said second voltage, and an N-well connected to said high voltage;
- an N-type pull-down transistor, having a gate connected to said NOR-gate, a source connected to ground, and a P-well connected to said ground; and
- an output line connecting outputs of said P-type and said N-type transistors to said device operating from the power supply at the second voltage.

25. A buffer for connecting a CMOS chip having a circuit operating from a power supply at a first voltage to a device operating from a power supply at a second voltage, said buffer comprising:
- an input portion having
  - means for receiving an input signal from said other device through a connection PAD;
  - means for converting said input signal to a signal level associated with said first voltage; and
- an output portion having
  - first voltage conversion means for converting a data output signal from said CMOS chip to a signal level associated with a high voltage;
  - second voltage conversion means for converting an enable output signal from said CMOS chip to said high voltage;
  - combining means for combining the output signals from said first and second voltage conversion means;
  - a P-type pull-up transistor, having a gate connected to said combining means, a source connected to said second voltage, and a N-well connected to said high voltage;
  - a N-type pull-down transistor, having a gate connected to said combining means, a source connected to a ground, and a P-well connected to said ground; and
  - output line means for connecting outputs of said P-type and said N-type transistor to said other devices through said connection PAD.

26. A input/output buffer for connecting a CMOS chip having a circuit operating from a power supply at a first voltage to a device operating from a power supply at a second voltage through a connection PAD on the CMOS chip, said input/output buffer comprising:
- an input buffer having
  - an input line means for receiving an input signal from said connection PAD;
  - a control line means for receiving a control signal, said control signal indicating the presence of a transmission signal from the peripheral system;
  - switching means, connected to said input line means and said control line means, for forcing said input signal to a pre-defined voltage that is no greater than said first voltage, if the control signal indicates that no transmission signal is present, and for converting said input signal to a signal level associated with said first voltage, otherwise; and first output line means, connected to said switching means for transmitting a signal output from said switching means to said chip; and an output buffer having first voltage conversion means for converting a data output signal from said CMOS chip to a signal level associated with said high voltage;

second voltage conversion means for converting an enable output signal from said CMOS chip to a signal level associated with said high voltage;

a NAND-gate receiving outputs from said first and second voltage conversion means;

a NOR-gate receiving outputs from said first and second voltage conversion means;

a P-type pull-up transistor, having a gate connected to said NAND-gate, a source connected to said second voltage, and an N-well connected to said high voltage;

an N-type pull-down transistor, having a gate connected to said NOR-gate, a source connected to ground, and a P-well connected to said ground; and second output line means for connecting outputs of said P-type and said N-type transistors to said device through said connection PAD.

27. In a CMOS chip having a plurality of connection PADS for connecting a circuit of said chip to a plurality of other devices, an improvement comprising:

an input/output buffer means, connected to each pad, for buffering signals transmitted between said circuit of said CMOS chip and one of said other devices, wherein each input/output means includes output means for converting a CMOS chip logic output signal associated with an internal voltage of said circuit of said CMOS chip to a logic output signal level associated with a voltage level of said one of said devices; and input means for converting a logic input signal from said one of said devices to a logic level associated with said voltage of said circuit of said CMOS chip; and wherein a portion of said connection PADS are connected to devices operating from power supplied at a first external voltage and wherein a second portion of said connection PADS are connected to device operating from power supplied at a second external voltage.

28. A method for transmitting signals from a CMOS chip having a circuit operating from a power supply at a first voltage to a device operating from a power supply at a second voltage, said method comprising the steps of:

converting a data output signal from said CMOS chip to a signal level associated with a high voltage;

converting an enable output signal from said CMOS chip to said signal level associated with said high voltage;

combining said converted data and output enable signals to generate a first output signal corresponding to a NAND combination of said converted data and output enable signals; and combining said converted data and output enable signals to generate a second output signal corresponding to a NOR combination of said converted data and output enable signals;

passing said converted data and output enable signals through a P-type pull-up transistor, having a source connected to said second voltage and an N-well connected to said high voltage; and passing said converted data and output enable signals through an N-type pull-down transistor, having a source connected to a ground, and a P-well connected to said ground; and combining outputs from said P-type and N-type transistors to form a combined output signal for transmission to said device.

29. The method of claim 28, further including steps for inputting signals from said other devices to said CMOS chip, said input method comprising the steps of:

receiving a input signal from said other devices;

receiving a control signal, said control signal indicating the presence of a transmission signal from the peripheral system; and forcing said input signal to a pre-defined voltage level that is no greater than said first voltage level, if the control signal indicates that no transmission signal is present, and converting said input signal to a signal level associated with said first voltage level, otherwise.

30. A method for transmitting signals from a CMOS chip to a device connected to said CMOS chip through a connection PAD, with a circuit of said device operating from a power supply at a first voltage level and said device operating from a power supply at a second voltage, said method comprising the steps of:

inputting signals by receiving an input signal from said connection PAD;

receiving a control signal, said control signal indicating the presence of a transmission signal from the peripheral system;

forcing said input signal to a pre-defined voltage that is no greater than said first voltage, if the control signal indicates that no transmission signal is present;

converting said input signal to a signal level associated with said first voltage, otherwise; and transmitting a resulting signal to said chip; and outputting signals by converting a data output signal from said CMOS chip to a signal level associated with a high voltage;

converting an enable output signal from said CMOS chip to a signal level associated with said high voltage;

passing said converted data and enable output signals through a NAND-gate;

passing said converted data and output enable signals thorough a NOR-gate;

passing an output signal from said NAND gate through a P-type pull-up transistor, having a gate connected to said NAND-gate, a source connected to said second voltage, and an N-well connected to said high voltage;

passing an output signal from said NOR gate through a N-type pull-down transistor, having a gate connected to said NOR-gate, a source connected to ground, and a P-well connected to said ground; and combining outputs of said P-type and said N-type transistor, and transmitting said combined outputs to said device through said connection PAD.

* * * * *